(12) United States Patent
David

(10) Patent No.: US 11,750,178 B2
(45) Date of Patent: Sep. 5, 2023

(54) FLIP-FLOP WITH INPUT AND OUTPUT SELECT AND OUTPUT MASKING THAT ENABLES LOW POWER SCAN FOR RETENTION

(71) Applicant: Silicon Laboratories Inc., Austin, TX (US)

(72) Inventor: Thomas Saroshan David, Lakeway, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/517,054

(22) Filed: Nov. 2, 2021

(65) Prior Publication Data

US 2023/0133269 A1   May 4, 2023

(51) Int. Cl.
| H03K 3/356 | (2006.01) |
| H03K 3/012 | (2006.01) |
| H03K 3/037 | (2006.01) |

(52) U.S. Cl.
CPC ....... *H03K 3/356121* (2013.01); *H03K 3/012* (2013.01); *H03K 3/0375* (2013.01)

(58) Field of Classification Search
CPC . H03K 3/356121; H03K 3/012; H03K 3/0375
See application file for complete search history.

(56) References Cited

U.S. PATENT DOCUMENTS

| 7,457,998 | B1* | 11/2008 | Bhatia | G01R 31/318541 |
| | | | | 714/724 |
| 7,788,558 | B2* | 8/2010 | Shimooka | G01R 31/318536 |
| | | | | 714/726 |
| 2001/0049174 | A1* | 12/2001 | Pitts | G11C 29/028 |
| | | | | 438/381 |
| 2008/0115025 | A1* | 5/2008 | Frederick | G01R 31/318541 |
| | | | | 714/732 |
| 2014/0208176 | A1* | 7/2014 | Parikh | G01R 31/318541 |
| | | | | 714/727 |

OTHER PUBLICATIONS

Hager, Pascal Alexander et al. "A Scan-Chain Based State Retention Methodology for IoT Processors Operating on Intermittent Energy." ©2017 IEEE *Design, Automation and Test in Europe*. pp. 1171-1176.

* cited by examiner

*Primary Examiner* — Sibin Chen
(74) *Attorney, Agent, or Firm* — Gary Stanford; Huffman Law Group, PC

(57) ABSTRACT

A flip-flop including a scan enable input for receiving a scan enable signal, a clock input for receiving a clock signal, input select circuitry that is configured to select between a data input and a scan input based on a state of the scan enable signal for providing a selected input, latching circuitry that is configured to latch the selected input to a preliminary output node in response to transitions of the clock signal, and output select circuitry that is configured to provide a state of the preliminary output node to a selected one of a scan output and a data output based on a state of the scan enable signal. The flip-flop may be implemented using fast yet leaky transistors. The data output may be disabled to prevent toggling other circuitry when scanning into or out of a memory for data retention.

20 Claims, 2 Drawing Sheets

FLIP-FLOP WITH INPUT AND OUTPUT SELECT AND OUTPUT MASKING THAT ENABLES LOW POWER SCAN FOR RETENTION

BACKGROUND OF THE INVENTION

Field of the Invention

The present invention relates in general to flip-flop and register circuits, and more particularly to flip-flop with input and output select and output masking that enables the use of fast leaky devices for performance in combination with low power scan for data retention during low power modes.

Description of the Related Art

Transistors may be optimized for different functions. High threshold voltage (HVT) transistors may be used to reduce power consumption for power critical functions in which switching speed is less important. Low voltage threshold (LVT) transistors and even super LVT (SLVT) transistors have faster transitions and may be used for timing critical functions or to achieve high performance. The LVT and SLVT transistors, however, are leaky transistor devices and contribute to higher currents and increased power consumption during low power modes. As used herein, LVT and SLVT transistors are referred to as leaky transistors. Registers, for example, may be implemented with an array of two or more flip-flops, each configured using leaky transistors to achieve desired speed and to increase performance during normal operation. In some process nodes, random-access memory (RAM) devices have lower leakage current than high speed registers implemented using leaky transistors. In such cases, the contents of the registers may be shifted into RAM for temporary storage during sleep mode. Upon subsequent wake up, the contents of the RAM are scanned back out into the registers to resume normal operation.

The mechanism for scanning registers into RAM involves toggling the outputs of the flip-flops of the registers during scan-in for store (from registers into RAM to enter low power mode) and scan-out for restore (from RAM back into the registers to resume normal operation). The outputs of each register are coupled to devices down-stream, so that toggling the registers during both scan-in and scan-out toggles most if not all of the logic of the IC resulting in a power surge that is substantially larger than power consumption during normal operation. A power supply providing power to the IC, such as a low-dropout (LDO) regulator or the like located on-chip or off-chip, is usually designed to provide sufficient power based on toggling of only about 20% of the logic on average during normal operation. The scan-in and scan-out process, however, can consume as much as 5-10 times the normal power consumption, so that voltage supply devices providing power must be upsized to handle the power surge during scanning, which adds cost to the overall design. In addition, these power surges that occur for both entering and exiting any low power mode substantially increases the power-cost of low power mode.

SUMMARY OF THE INVENTION

A flip-flop implemented according to one embodiment includes a scan enable input for receiving a scan enable signal, a clock input for receiving a clock signal, input select circuitry that is configured to select between a data input and a scan input based on a state of the scan enable signal for providing a selected input, latching circuitry that is configured to latch the selected input to a preliminary output node in response to transitions of the clock signal, and output select circuitry that is configured to provide a state of the preliminary output node to a selected one of a scan output and a data output based on a state of the scan enable signal. The flip-flop may be implemented using leaky transistors, such as low voltage threshold transistors or super low voltage threshold transistors or the like.

The input select circuitry may be configured as a multiplexer having a first data input coupled to the scan input, having a second data input coupled to the data input, having a select input receiving the scan enable signal, and having an output providing the selected input. The latching circuitry may include a first latch that latches the selected input to a latch node in response to the clock signal transitioning to a first state, and a second latch that latches the latch node to the preliminary output node in response to the clock signal transitioning to a second state.

The output select circuitry may include data select circuitry and scan select circuitry. The data select circuitry receives the scan enable signal and is configured to pass the state of the preliminary output node to the data output when the scan enable signal is in a first state. The scan select circuitry receives the scan enable signal and is configured to pass the state of the preliminary output node to the scan output when the scan enable signal is in a second state. In one embodiment, the data select circuitry and the scan select circuitry each include a pass gate and a buffer. The pass gate is controlled by the scan enable signal, has an input coupled to the preliminary output node and has an output, and the buffer has an input coupled to the output of the pass gate and has an output. Each flip-flop may include disable circuitry that disables the data output when not selected by the scan enable signal.

An integrated circuit implemented according to one embodiment includes multiple registers, each including multiple flip-flops including a first flip-flop and a last flip-flop. Each of the flip-flops includes a scan enable input for receiving a scan enable signal, a clock input for receiving a clock signal, input select circuitry that is configured to select between a data input and a scan input based on a state of the scan enable signal for providing a selected input, latching circuitry that is configured to latch the selected input to a preliminary output node in response to transitions of the clock signal, and output select circuitry that is configured to provide a state of the preliminary output node to a selected one of a scan output and a data output based on a state of the scan enable signal. Again, the flip-flops of the integrated circuit may be implemented using leaky transistors, such as low voltage threshold transistors or super low voltage threshold transistors or the like.

The scan input of each flip-flop other than the first flip-flop of each register may be coupled to a scan output of a prior flip-flop of a corresponding register, and the scan output of each flip-flop other than the last flip-flop of each register may be coupled to a scan input of a next flip-flop of the corresponding register.

The integrated circuit may include a static random-access memory having inputs each coupled to a scan output of the last flip-flop of a corresponding register, and having outputs each coupled to a scan input of the first flip-flop of a corresponding register.

The integrated circuit may include control circuitry that is configured to assert the scan enable signal for a scan in mode to store data from the registers into the static random-access memory, and to assert the scan enable signal for a scan out mode to write data stored in the static random-access memory back into the registers. The control circuitry may provide at least one read/write enable signal for enabling the scan in mode and may provide the at least one read/write enable signal for enabling the scan out mode.

The integrated circuit may include a circuitry cloud coupled to the data output of a subset of the flip-flops, or to the data output of each flip-flop. Each flip-flop may further include disable circuitry that disables the data output when not selected by the scan enable signal.

A method of retaining data of flip-flops of an integrated circuit may include configuring each of the flip-flops with a scan enable input and input select circuitry for selecting between a data input and a scan input based on a state of a scan enable signal provided to the scan enable input, configuring each flip-flop with output select circuitry for selecting between a data output and a scan output based on a state of the scan enable signal, coupling the scan input of each flip-flop to a selected one of the scan output of another one of the flip-flop and an output of a memory, coupling the scan output of each flip-flop to a selected one of the scan input of another flip-flop and an input of the memory, and asserting the scan enable signal and a read mode of the memory for transferring data stored flip-flops to the memory.

The method may include asserting the scan enable signal and a write mode of the memory for transferring data stored in the memory to the flip-flop. The method may include disabling the data output of each flip-flop while asserting the scan enable signal. The method may include implementing each flip-flop with leaky transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A flip-flop circuit implemented according to embodiments described herein masks the output pin and instead uses a dedicated scan output pin to connect to a scan input pin of an adjacent flop during both scan-in and scan-out functions. This masking of the output pin prevents the down-stream logic from toggling during the scan process thus resulting in extensive power savings during mode transitioning. In addition, devices regulating power need not be oversized. In addition, as described herein, masking is performed within each flip-flop thereby avoiding the need to isolate the retained from the non-retained logic.

Figure 1:
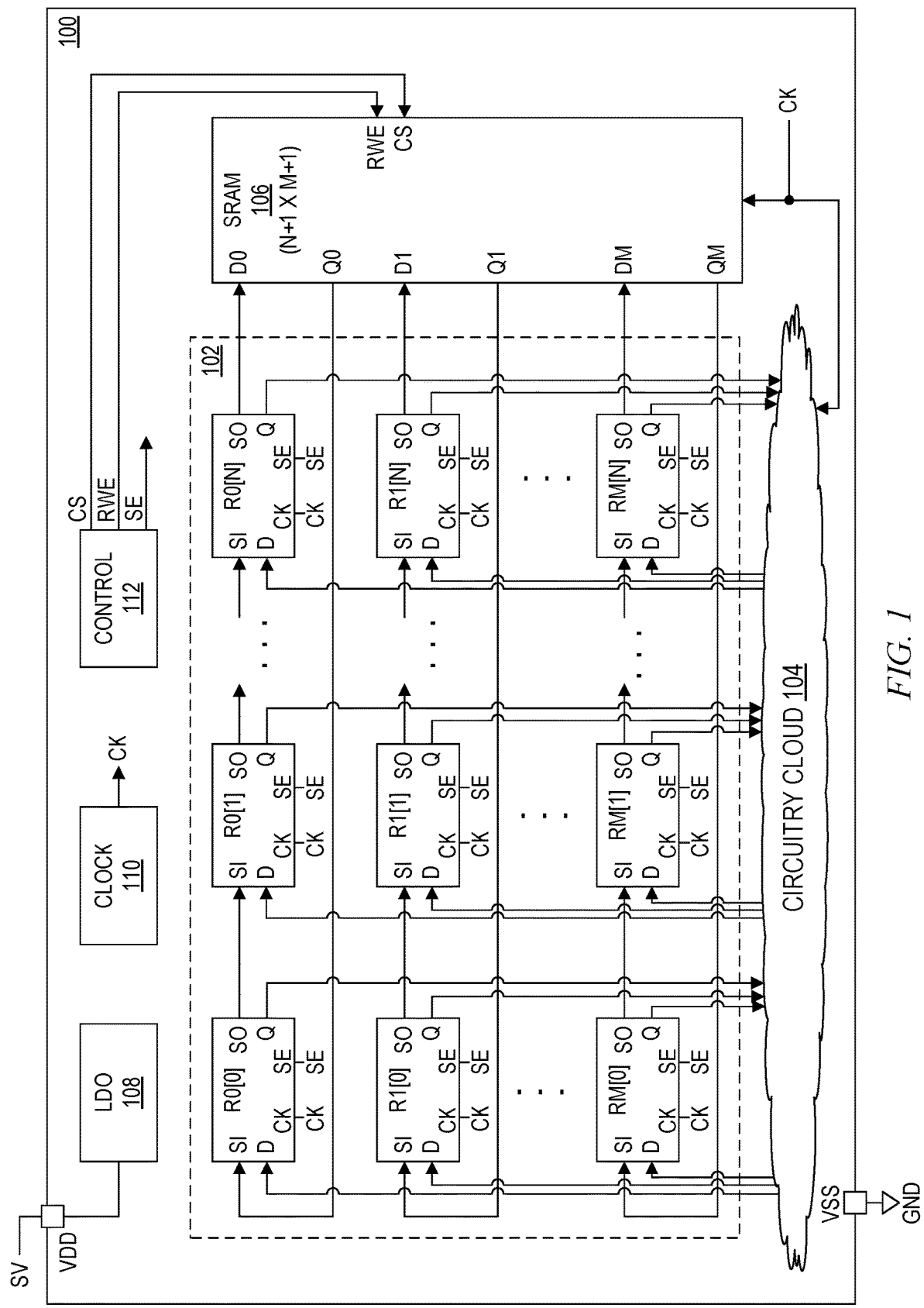
FIG. 1 is a simplified schematic and block diagram of an integrated circuit (IC) implemented according to one embodiment of the present disclosure.

FIG. 1 is a simplified schematic and block diagram of an integrated circuit (IC) 100 implemented according to one embodiment of the present disclosure. The IC 100 includes an array of D-type flip-flops (DFFs) 102, a circuitry cloud 104, a static random-access memory (SRAM) 106, an on-chip low-dropout (LDO) regulator 108, clock circuitry 110, and control circuitry 112. The array of DFFs 102 may be organized as a set of M+1 registers R0, R1, . . . , RM (R0-RM) each having N+1 (numbered 0 to N) bits in which each bit is stored in a corresponding one of the array of DFFs 102. It is noted that M and N are integers having any suitable value for registering any suitable number of bits depending upon the particular implementation. Each DFF 102 includes a data input (D) and a data output (Q) each coupled to corresponding inputs and outputs, respectively, of the circuitry cloud 104. The circuitry cloud 104 may include any combination of logic devices and combinatorial circuitry, including, for example, Boolean logic gates, transistors, discrete devices, etc., and is not further described. In the illustrated embodiment, the SRAM 106 may have a size of N+1 words by M+1 bits for storing the entire contents of the array of DFFs 102 during low power modes as further described herein. If desired, the SRAM 106 may be smaller to store only a subset of the registers or may be larger for storing additional information.

The IC 100 is shown including supply voltage pins VDD and VSS in which VDD receives a supply voltage (SV) (e.g., 1V, 3V, 5V, etc.) and VSS is coupled to a supply reference voltage, such as ground (GND). Within the IC 100, the VDD pin is shown coupled to an input of the LDO regulator 108, which provides power to various internal circuitry of the IC 100 including the array of DFFs 102 and the SRAM 106. The clock circuitry 110 generates a clock signal CK provided to clock (CK) inputs of each of the DFFs 102, to a clock input of the SRAM 106, and to clock inputs of the circuitry cloud 104. Although only one clock signal is shown, it is appreciated that multiple clock signals may be distributed across the IC 100 each derived from a master clock signal or the like.

The control circuitry 112 may perform various operations including power control functions or the like. As shown, the control circuitry 112 outputs a chip select (CS) output provided to a corresponding CS input of the SRAM 106 for enabling the SRAM 106 for memory operations, and outputs a read/write enable (RWE) provided to a corresponding RWE input of the SRAM 106. RWE is asserted (e.g., high) to select a read operation for storing information from the DFFs 102, and which is asserted (e.g., low) to select the write operation for writing stored data to the DFFs 102. The control circuitry 112 further outputs a scan enable (SE) signal to SE inputs of each of the DFFs 102. Each of the DFFs 102 further includes a scan-in (SI) input and a scan-out (SO) output for serially shifting data between the DFFs 102 and the SRAM 106 as further described herein.

In the simplified configuration, the SRAM 106 includes a set of M+1 inputs D0, D1, . . . , DM (D0-DM), each coupled to the SO output of the Nth DFF 102 of each of the M+1 registers. As shown, the SO output of DFF R0[N] is coupled to the D0 input of the SRAM 106, the SO output of DFF R1[N] is coupled to the D1 input of the SRAM 106, and so on up to the SO output of DFF RM[N], which is coupled to the DM input of the SRAM 106.

The SRAM 106 further includes a set of M+1 outputs Q0, Q1, . . . , QM (Q0-QM), each coupled to a corresponding one of the SI inputs of the first ones (or left-most ones) of the DFFs 102 of each of the registers, or DFFs R0[0], R1[0], . . . , RM[0]. As shown, Q0 is coupled to the SI input of DFF R0[0], Q1 is coupled to the SI input of DFF R1[0], and so on. The SI input of each of the remaining DFFs 102 is coupled to the SO output of an adjacent DFF. As shown, the SO output of DFF R0[0] is coupled to the SI input of DFF R0[1], the SO output of DFF R1[0] is coupled to the SI input of DFF R1[1], and so on up to the SO output of DFF RM[0], which is coupled to the SI input of DFF RM[1]. This pattern is repeated throughout the array of DFFs 102, including the SO output of each of the DFFs R0[N−1] to RM[N−1] (not shown) being coupled to the respective SI inputs of the last column of DFFs R0[N] to RM[N].

During normal operation when the IC 100 is powered up, the control circuitry 112 de-asserts or otherwise negates the SE signal so that each of the DFFs 102 selects its D input and its Q output. In this manner, the array of DFFs 102 and the circuitry cloud 104 perform normal operations which are not further described. The DFFs 102 may be configured with leaky transistors (such as, for example, LVT or even SLVT transistors) to achieve high speed and performance. Such transistors, however, consume excessive power during any low power modes because they are leaky.

When it is desired to place the IC 100 into a low power mode (e.g., such as a standby mode or a sleep mode or the like), the contents of each of the DFFs 102 is first stored into the SRAM 106. The control circuitry 112 asserts SE so that each of the DFFs 102 selects its SI input and SO output rather than its D input and Q output, respectively. The control circuitry 112 asserts CS to enable the SRAM 106 and asserts RWE to place the SRAM 106 into a read mode (e.g., RWE is asserted high). In successive CK cycles, the data stored in the array of DFFs 102 forming the registers R0-RM is serially shifted into the respective D inputs of the SRAM 106. This is achieved without toggling any of the Q outputs of the DFFs 102, so that devices within the circuitry cloud 104 are not toggled during the scan-in operation. Once the register data is stored into the SRAM 106, the IC 100 may be placed into low power mode.

After power up when it is desired to resume operations, the control circuitry 112 outputs CS to enable the SRAM 106 and outputs RWE to select the write operation. The control circuitry 112 asserts SE so that each of the DFFs 102 selects its SI input and SO output rather than its D input and Q output, respectively. In successive CK cycles, the data stored in the SRAM 106 is serially shifted out of the Q0-QM outputs into the array of DFFs 102 forming the R0-RM registers. Again, this is achieved without toggling any of the Q outputs of the DFFs 102, so that devices within the circuitry cloud 104 are not toggled during the scan out operation. Once the register data is restored from the SRAM 106, normal operations of the IC 100 may be resumed.

It is appreciated that each of the DFFs 102 is configured with an SI input and an SO output for serially shifting register data into the SRAM 106 serially shifting register data out of the SRAM 106 without toggling devices in the circuitry cloud 104. Such scan-in and scan-out operation saves a considerable amount of power. Normally, the LDO 108 only needs to be designed based on power consumption for normal operations in which only about 20% or so of the circuitry cloud 104 is toggled at a time. If the DFFs were conventionally designed without the SI inputs and SO outputs, substantially all of the devices of the circuitry cloud 104 would be toggled causing significant power surges during both scan-in and scan-out operations. In the manner, the LDO 108 would need to provide 5-10 times the amount of power for such scan operations. Thus, the LDO 108 would need to be oversized relative to normal operation in order to provide the needed power for scan operations. The configuration of the DFFs 102, however, avoids excessive power surges during scan operations so that the LDO 108 need not be oversized.

Figure 2:
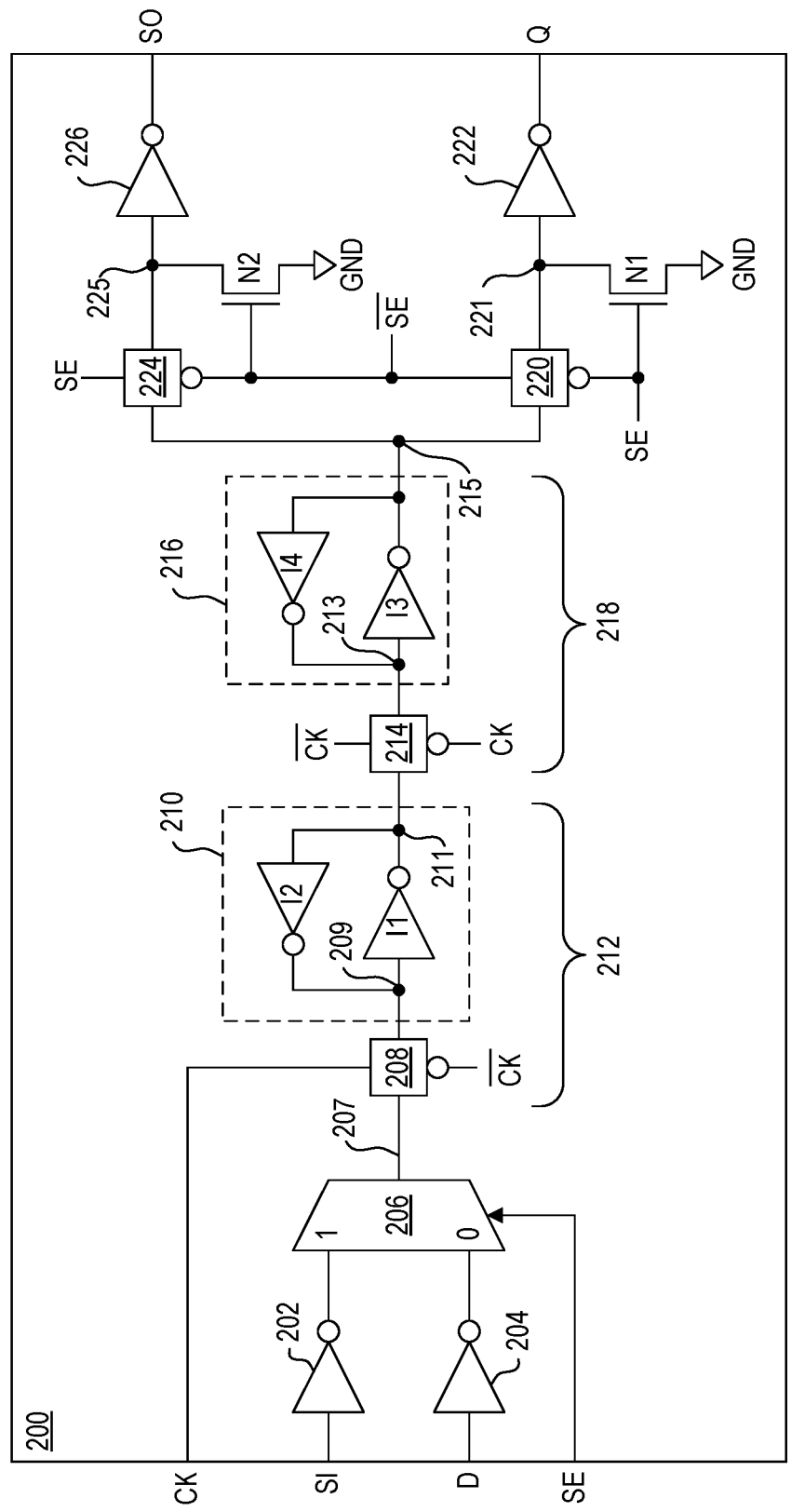
FIG. 2 is a schematic diagram of a DFF implemented according to an exemplary embodiment of the present disclosure, which may be used to implement any of the DFFs of the IC of FIG. 1.

FIG. 2 is a schematic diagram of a DFF 200 implemented according to an exemplary embodiment of the present disclosure, in which the DFF 200 may be used to implement any of the DFFs 102 of the IC 100. The SI input is provided to the input of an inverter 202 and the D input is provided to the input of another inverter 204, in which the inverters 202 and 204 have outputs provided to the logic "1" and logic "0" inputs, respectively, of a 2-input MUX 206. The SE input is provided to a control input of the MUX 206, having an output provided to a node 207 which is coupled to an input of a pass (or transmission) gate 208. The pass gate 208 may be configured as an N-channel transistor, such as an NMOS transistor, coupled in parallel with a P-channel transistor, such as a PMOS transistor, each having a control terminal (e.g., gate terminal) receiving the CK signal or an inverted version thereof, shown as $\overline{CK}$. When CK is high, $\overline{CK}$ is low and vice-versa.

As shown, for example, the pass gate 208 includes an NMOS transistor having a drain terminal coupled to node 207, having a source terminal coupled to a node 209, and having a gate terminal receiving CK. The pass gate 208 further includes a PMOS transistor having a source terminal coupled to node 207, having a drain terminal coupled to node 209, and having a gate terminal receiving $\overline{CK}$. The gate terminal of the NMOS transistor may also be referred to as the non-inverting input of the pass gate 208, having an inverting input at the gate terminal of the PMOS transistor. Node 209 is further coupled to an input of a "keeper" circuit 210, which has an output coupled to a latch node 211. In the illustrated embodiment, the keeper circuit 210 is configured as a pair of cross-coupled inverters I1 and I2, meaning that the input of I1 is coupled to the output of I2 at node 209, and the output of I1 is coupled to the input of I2 at the latch node 211. The pass gate 208 and the keeper circuit 210 collectively form a master latch 212.

The latch node 211 is further coupled to the input of another pass gate 214, having an output coupled to a node 213. Another keeper circuit 216 has an input coupled to node 213 and an output coupled to a preliminary output node 215. The pass gate 214 may be configured in similar manner as the pass gate 208 having an NMOS and a PMOS transistor coupled in parallel, in which $\overline{CK}$ is provided to the non-inverting input (at the gate of the NMOS transistor) and CK is provided to the inverting input (at the gate of the PMOS transistor). The keeper circuit 216 may also be configured in a similar manner as the keeper circuit 210, including cross-coupled inverters I3 and I4. The pass gate 214 and the keeper circuit 216 collectively form a slave latch 218.

The preliminary output node 215 is further coupled to an input of another pass gate 220, having an output coupled to a node 221. An inverting buffer 222 has an input coupled to node 221 and an output providing the Q output of the DFF 200. The pass gate 220 has an inverting input receiving SE and a non-inverting input receiving an inverted version of SE, or $\overline{SE}$. An NMOS transistor N1 has a drain terminal coupled to node 221, a gate terminal receiving SE, and a source terminal coupled to GND. Another pass gate 224 has an input coupled to the preliminary output node 215 and an output coupled to a node 225, and another inverting buffer 226 has an input coupled to node 225 and an output providing the SO output of the DFF 200. The pass gate 224 has a non-inverting input receiving SE and an inverting input receiving $\overline{SE}$. Another NMOS transistor N2 has a drain terminal coupled to node 225, a gate terminal receiving $\overline{SE}$, and a source terminal coupled to GND.

In operation of the DFF 200, when SE is asserted low (so that $\overline{SE}$ is asserted high) data at the D input is inverted and provided through MUX 206 and asserted on node 207. The MUX 206 bypasses the state of input SI. When CK goes high, the pass gate 208 is opened and the pass gate 214 is closed, so that the data on node 207 is inverted and provided on latch node 211. It is noted that the upper inverter I2 may be made weaker than the lower inverter I1 so that any prior logic state at latch node 211 is over-ridden by the new data provided at node 207, so that the master latch 212 drives the state of D on latch node 211 while CK is high. The state of the latch node 211 is latched when CK goes low. When CK does goes low, the pass gate 208 is closed while the pass gate 214 is opened, so that the data on latch node 211 is inverted and driven to the preliminary output node 215 by the keeper circuit 216. The state of node 215 is considered latched when CK next goes high. Since SE is low and is $\overline{SE}$ high, the pass gate 220 is turned on to pass the data at node 215 to node 221, which is inverted again by the inverting buffer 222 and driven as the output Q. It is noted that the input data provided on D is inverted four times and ultimately asserted as the output data on Q after one cycle of CK according to normal DFF operation. Since the pass gate 224 is off or closed, the data transfer for normal operation does not affect that state of SO. In fact, N2 is turned on to hold node 225 low and SO high while SE is low.

When SE is asserted high (so that $\overline{SE}$ is asserted low), operation is similar except that data at the SI input is inverted and provided through MUX 206 and asserted on node 207. In this case, the MUX 206 bypasses the state of input D. When CK goes high, the SI data is inverted again and provided on the latch node 211, and when CK next goes low, the SI data is inverted again and provided on the preliminary node 215. In this case, since SE is high and is $\overline{SE}$ low, the pass gate 224 is turned on to pass the data at node 215 to node 225, which is inverted again by the inverting buffer 226 and driven as the output SO. It is noted that the input data provided on SI is inverted four times and ultimately asserted as the output data on SO after one cycle of CK according to scan operation. Since the pass gate 220 is off or closed, the data transfer for scan operation does not affect that state of Q. In fact, N1 is turned on to hold node 221 low and D high while SE is high. Since Q is held in a steady state during scan operation, it does not toggle any down-stream devices in the circuitry cloud 104 during scan operation (either scan-in or scan-out), so that there is no excessive increase in power consumption during scan operation.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A flip-flop, comprising:
a scan enable input for receiving a scan enable signal;
a clock input for receiving a clock signal;
input select circuitry that is configured to select between a data input and a scan input based on a state of the scan enable signal for providing a selected input on a first node;
latching circuitry comprising a plurality of latches coupled in series between the first node and a preliminary output node that is configured to latch the selected input to the preliminary output node in response to transitions of the clock signal; and
output select circuitry that is configured to provide a state of the preliminary output node to a selected one of a scan output and a data output based on a state of the scan enable signal, and that is configured to mask the preliminary output node from the data output when the scan output is selected, wherein the output select circuitry comprises:
 a first pass gate controlled by the scan enable signal having an input coupled to the preliminary output node and having an output, and a first buffer having an input coupled to the output of the first pass gate and having an output providing the data output; and
 a second pass gate controlled by the scan enable signal having an input coupled to the preliminary output node and having an output, and a second buffer having an input coupled to the output of the second pass gate and having an output providing the scan output.

2. The flip-flop of claim 1, wherein the input select circuitry comprises a multiplexer having a first data input coupled to the scan input, having a second data input coupled to the data input, having a select input receiving the scan enable signal, and having an output providing the selected input.

3. The flip-flop of claim 1, wherein the latching circuitry comprises:
a first latch that latches the selected input to a latch node in response to the clock signal transitioning to a first state; and
a second latch that latches the latch node to the preliminary output node in response to the clock signal transitioning to a second state.

4. The flip-flop of claim 1, wherein:
the first pass gate and the first buffer comprise data select circuitry receiving the scan enable signal that is configured to pass the state of the preliminary output node to the data output when the scan enable signal is in a first state; and
wherein the second pass gate and the second buffer comprise scan select circuitry receiving the scan enable signal that is and configured to pass the state of the preliminary output node to the scan output when the scan enable signal is in a second state.

5. The flip-flop of claim 1, further comprising:
a first transistor coupled to the output of the first pass gate that holds the output of the first pass gate low when the scan enable signal is in a first state; and
a second transistor coupled to the output of the second pass gate that holds the output of the second pass gate low when the scan enable signal is in a second state.

6. The flip-flop of claim 1, further comprising disable circuitry that disables the data output when not selected by the scan enable signal.

7. The flip-flop of claim 1, wherein the input select circuitry, the latching circuitry, and the output select circuitry are implemented using leaky transistors.

8. An integrated circuit, comprising:
a plurality of registers, each comprising a plurality of flip-flops including a first flip-flop and a last flip-flop, each of the plurality of flip-flops comprising:
 a scan enable input for receiving a scan enable signal;
 a clock input for receiving a clock signal;

input select circuitry that is configured to select between a data input and a scan input based on a state of the scan enable signal for providing a selected input on a first node;

latching circuitry comprising a plurality of latches coupled in series between the first node and a preliminary output node that is configured to latch the selected input to the preliminary output node in response to transitions of the clock signal; and output select circuitry that is configured to provide a state of the preliminary output node to a selected one of a scan output and a data output based on a state of the scan enable signal, and that is configured to mask the preliminary output node from the data output when the scan output is selected, wherein the output select circuitry comprises:
- a first pass gate controlled by the scan enable signal having an input coupled to the preliminary output node and having an output, and a first buffer having an input coupled to the output of the first pass gate and having an output providing the data output; and
- a second pass gate controlled by the scan enable signal having an input coupled to the preliminary output node and having an output, and a second buffer having an input coupled to the output of the second pass gate and having an output providing the scan output.

9. The integrated circuit of claim 8, wherein the plurality of flip-flops are implemented using leaky transistors.

10. The integrated circuit of claim 8, wherein the scan input of each of the plurality of flip-flops other than the first flip-flop of each of the plurality of registers is coupled to a scan output of a prior flip-flop of a corresponding one of the plurality of registers, and wherein the scan output of each of the plurality of flip-flops other than the last flip-flop of each of the plurality of registers is coupled to a scan input of a next flip-flop of the corresponding one of the plurality of registers.

11. The integrated circuit of claim 10, further comprising a static random-access memory having a plurality of inputs each coupled to a scan output of the last flip-flop of a corresponding one of the plurality of registers, and having a plurality of outputs each coupled to a scan input of the first flip-flop of a corresponding one of the plurality of registers.

12. The integrated circuit of claim 11, further comprising control circuitry that is configured to assert the scan enable signal for a scan in mode to store data from the plurality of registers into the static random-access memory, and to assert the scan enable signal for a scan out mode to write data stored in the static random-access memory back into the plurality of registers.

13. The integrated circuit of claim 12, wherein the control circuitry provides at least one read/write enable signal for enabling the scan in mode and provides the at least one read/write enable signal for enabling the scan out mode.

14. The integrated circuit of claim 8, further comprising a circuitry cloud coupled to the data output of a subset of the plurality of flip-flops.

15. The integrated circuit of claim 8, further comprising a circuitry cloud coupled to the data output of each of the plurality of flip-flops.

16. The integrated circuit of claim 8, wherein each of the plurality of flip-flops further comprises disable circuitry that disables the data output when not selected by the scan enable signal.

17. A method of retaining data of a plurality of flip-flops of an integrated circuit, comprising:
configuring each of the plurality of flip-flops with a scan enable input and input select circuitry for selecting between a data input and a scan input based on a state of a scan enable signal provided to the scan enable input and for providing a selected input on a first node;
providing each of the plurality of flip-flops with a plurality of latches coupled in series between the first node and a preliminary output node for latching the selected input from the first node to the preliminary output node;
configuring each of the plurality of flip-flops with output select circuitry for selecting between a data output and a scan output based on a state of the scan enable signal and for providing a state of the preliminary output node on a selected output, including masking the preliminary output node from the data output when the scan output is selected, wherein the output select circuitry comprises:
- a first pass gate controlled by the scan enable signal having an input coupled to the preliminary output node and having an output, and a first buffer having an input coupled to the output of the first pass gate and having an output providing the data output; and
- a second pass gate controlled by the scan enable signal having an input coupled to the preliminary output node and having an output, and a second buffer having an input coupled to the output of the second pass gate and having an output providing the scan output;

coupling the scan input of each of the plurality of flip-flops to a selected one of the scan output of another one of the plurality of flip-flops and an output of a memory;
coupling the scan output of each of the plurality of flip-flops to a selected one of the scan input of another one of the plurality of flip-flops and an input of the memory; and
asserting the scan enable signal and a read mode of the memory for transferring data stored in the plurality of flip-flops to the memory.

18. The method of claim 17, further comprising asserting the scan enable signal and a write mode of the memory for transferring data stored in the memory to the plurality of flip-flops.

19. The method of claim 17, further comprising disabling the data output of each of the plurality of flip-flops while asserting the scan enable signal.

20. The method of claim 17, further comprising implementing each of the plurality of flip-flops with leaky transistors.

* * * * *